United States Patent [19]

Taylor

[11] 4,302,065
[45] Nov. 24, 1981

[54] FLAT CABLE ASSEMBLY AND METHODS OF TERMINATING AND CONNECTORIZING THE CABLE OF SAME

[75] Inventor: Thomas J. Taylor, Gahanna, Ohio

[73] Assignee: Western Electric Company, Incorporated, New York, N.Y.

[21] Appl. No.: 135,033

[22] Filed: Mar. 28, 1980

[51] Int. Cl.³ .................... H05K 1/04; H02G 15/08
[52] U.S. Cl. ........................... 339/17 F; 339/99 R; 339/176 MF; 174/88 R
[58] Field of Search ............ 339/97, 98, 99 R, 17 F, 339/176 MF; 174/88 R, 117 FF; 29/828, 829, 860

[56] References Cited

U.S. PATENT DOCUMENTS

| 2,973,502 | 2/1961 | Tally | 339/61 |
| 3,715,457 | 2/1973 | Teagno et al. | 174/88 R |
| 3,772,776 | 11/1973 | Weisenburger | 29/830 |

*Primary Examiner*—Joseph H. McGlynn
*Assistant Examiner*—Frank H. McKenzie, Jr.
*Attorney, Agent, or Firm*—K. R. Bergum

[57] ABSTRACT

A flat cable assembly embodiment (10) is disclosed, as are two terminated cable embodiments (12,12') and methods for terminating and connectorizing same, when the cable is of the type wherein two overlying-/underlying arrays of laterally disposed conductors (13, 14, 13', 14') are respectively laminated between a common insulative center film (16, 16'), and an associated one of two opposite side outer insulative films (18, 19, 18', 19'), with a plurality of isolating strips (23, 24, 23', 24') interposed between, and adapted to adhere selectively to, the center film and an associated one of the two arrays of conductors. The isolating strips are positioned transversely across the center film in aligned pairs at each of a succession of predetermined terminating sites (e.g., at 5, 10 or 15 ft. intervals) along the cable, as fabricated. In accordance with one terminated cable embodiment (12), where the isolating strips (23, 24) are adapted to adhere only to the center film (16), a terminated end section (18a or 19a) of each outer film, and the associated array of conductor end portions (13a or 14a) bonded thereto, that are then coextensive, and in contact, with an associated one of the then leading pair of isolating strips (23 or 24), are separated from the latter, and sharply folded back upon themselves to form a male-type terminated cable end. This results in the then outermost major surfaces of the conductor end portions (13a, 14a) in each array advantageously being fully exposed (with no conventional insulation stripping operation being required) for connectorization, such as with a female card-edge type connector (26) having two mutually disposed arrays of conductor-mating contacts (31, 32).

35 Claims, 7 Drawing Figures

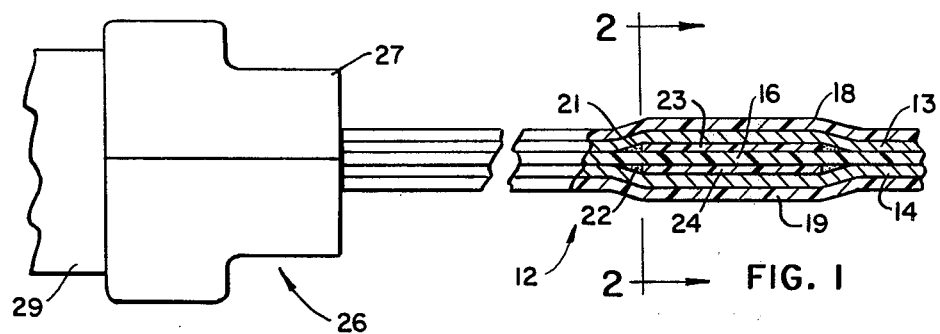
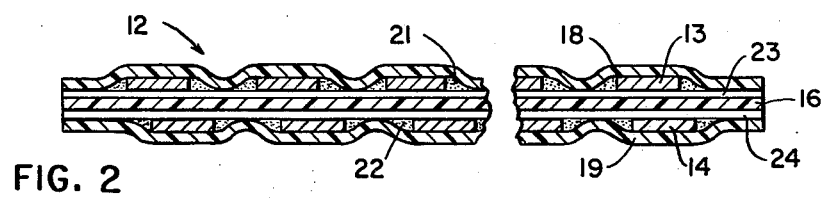
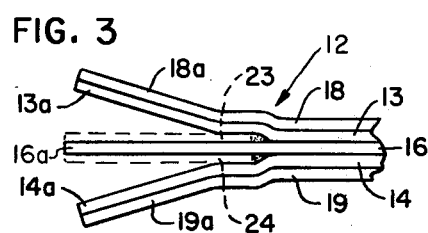
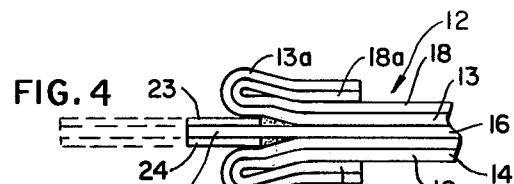
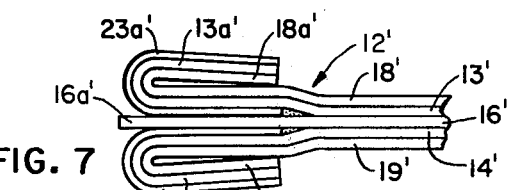
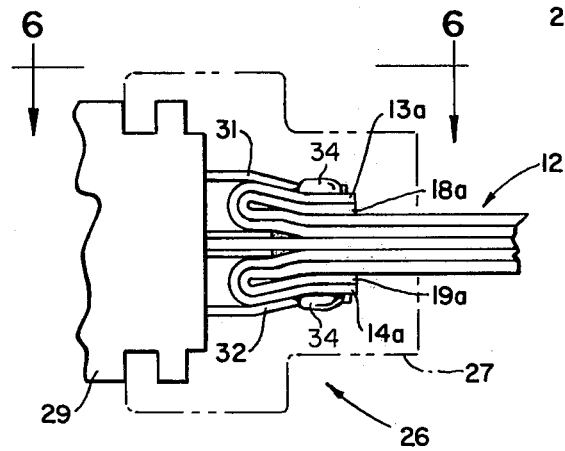
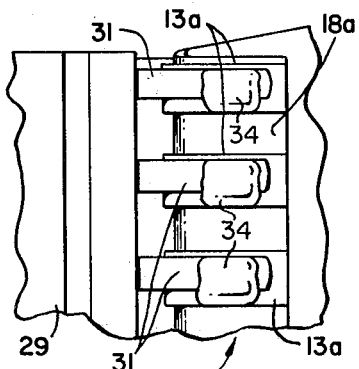

FLAT CABLE ASSEMBLY AND METHODS OF TERMINATING AND CONNECTORIZING THE CABLE OF SAME

BACKGROUND OF THE INVENTION

1. Field of the Invention

This invention relates to the connectorization of flat cable and, in particular, to such a cable of the type having two overlying/underlying arrays of conductors isolated by a common insulative center film, with each array being laminated between opposite sides of the center film and a different one of two insulated outer films.

2. Background of the Invention

In one particular type of flat cable designed for telephone under carpet cable applications, known as TUCC* flat cable (*registered trademark of the Western Electric Company), two precisely offset arrays of overlying/underlying conductors are separated by an insulative center film, with each array being adhesivey bonded directly to only the respectively adjacent one of two mutually disposed insulative outer films. The conductors are preferably of rectangular or ribbon configuration so as to allow a given flat cable to be fabricated with minimum thickness. This becomes of paramount importance when such cables must be folded back upon themselves, such as when used in certain under-carpet wiring applications. One preferred form of such a multi-arrayed cable is disclosed in a co-pending application of W. A. Elliott-T. J. Taylor, Ser. No. 106,599, filed Dec. 26, 1979, and assigned to the same assignee as the present invention.

Flat cables of the type in question have generally been connected to conventional solder type connectors, in particular, heretofore, by first stripping the insulation from short, terminated end regions of the conductors, and then positioning them in, and soldering them to, respectively aligned U-shaped solder cups or receptacles of the connector. As disclosed in a co-pending application of T. J. Taylor, Ser. No. 116,704, filed Jan. 30, 1980, also assigned to the same assignee as the present invention, it has proven advantageous to angularly twist such terminated stripped ends of the conductors a predetermined number of degrees, preferably in the range of 45 to 90 degrees from their original (horizontal) orientation as confined within the cable, prior to being nested within and soldered to the respectively associated connector receptacles. Such twisted conductor ends have been found to substantially improve soldered connection reliability, and facilitate lateral conductor displacement whenever required for alignment with the receptacles of a given connector.

Regardless whether the conductor ends of a flat cable of the type of primary concern herein are angularly twisted or not prior to their soldered connectorization, they normally must be completely stripped of insulation, which is a time consuming and relatively expensive operation.

There have also been a number of other techniques employed heretofore for terminating and connectorizing flat cables of various other types. For example, in S. K. Tally U.S. Pat. No. 2,973,502, two flat cables, each comprised of one or more ribbon conductors secured to only one side of a suitable plastic film, are laminated together such that the respectively aligned conductors in the two cables are brought into mating relationship. The composite cable is terminated by initially separating and thereafter folding an end section of each cable, including the one or more conductors bonded thereto, back upon itself in accordance with one illustrative embodiment. The resulting folded-back and exposed conductor ends may then be inserted into a female-type connector to effect cable conductor-connector contact engagement. Because of the as-fabricated mating relationship of the paired conductors within the composite cable, the overlying/underlying conductors cannot be separately accessed. As such, the composite cable, in actuality, functions as a flat cable with only a single array of laterally disposed conductors. Indeed, it is because of the mating contact between the respectively aligned overlying/underlying pairs of conductors that the terminated end of such a composite laminated cable may be subsequently re-divided into two cable end sections so as to effect the folded-back exposure of the commonly connected pairs of conductors for connectorization.

Another variation of a terminated and connectorized flat cable is disclosed in L. P. Weisenburger U.S. Pat. No. 3,772,776. In one embodiment of that patent, the terminating ends of an array of conductors, laminated between two insulative films, are stripped of insulation on only one side thereof. The terminated end of the cable is then folded back into an open U-shaped configuration, and thereafter inserted within a space defined between a substrate and an array of outwardly extending tunnel wires of a memory plane. Upon the exposed conductors being brought into respective engagement with the tunnel wires, soldered connections are completed therebetween. Thus, in establishing such soldered connections, it is seen that the insulation must first be removed from one side of the terminated, single array of cable conductors. Such an insulation stripping operation, as previously noted, can add appreciably to the costs involved in connectorizing a flat cable, even when only a single array of conductors are involved.

IBM Technical Disclosure Bulletin, Vol. 5, No. 11, April 1963, pages 22-23, discloses a technique for interconnecting two cables, each having a single array of conductors, wherein the insulation is first removed on only one side of each cable along a terminated end region thereof, with the partially stripped end regions of the two cables then being bent 90 degrees and brought into mating relationship within a receiving slot formed in a spring-biased, C-shaped clamping member. This technique for interconnecting two flat cables likewise cannot be employed to independently connectorize the conductors of a multi-arrayed cable, whether constructed in the manner of primary concern herein, or constructed as separate cables which are bonded or otherwise secured together to form a composite cable.

SUMMARY OF THE INVENTION

It, therefore, is an object of the present invention to provide simplified, inexpensive and reliable methods of terminating and connectorizing a flat cable having ribbon-like condutors, and a terminated cable and cable-connector assembly produced thereby.

In accordance with the principles of the present invention, the above and other objects are realized in the soldered connectorization of one preferred flat cable of the type wherein two precisely offset arrays of rectangularly shaped conductors are separated by a center film, with each array being adhesively bonded only to the respectively adjacent one of two mutually disposed outer films. Also preferably incorporated in such a cable, as fabricated, are a plurality of isolating strips which are positioned transversely across, and on each side of, the center film in aligned pairs at each of a succession of predetermined spaced terminating sites (e.g., at 5, 10, or 15 ft. intervals) along the cable. For further details as to the unique construction of the described flat cable per se, and the operating characteristics realized therewith, which are not of particular concern with respect to an understanding of the present invention, reference is made to the aforementioned co-pending application of W. A. Elliott et al.

In accordance with the principles involved in one preferred illustrative method of this invention, a terminated end section of each outer film, together with the coextensive array of conductor end portions bonded thereto, is separated from the initially contacting one of the two leading isolating strips and, thereafter, shaply folded back upon itself. This results in the outermost major surfaces of the folded-back conductor end portions in each array advantageously being fully exposed (with no conventional insulation stripping operation being required) for independent connectorization in a female or card-edge type connector. In order to facilitate the fold-back and exposure of the conductor end portions, the isolating strips are chosen of a material that does not adhere to either the contacting conductors or the associated one of the adhesive-backed outer films. Permanent securement of the cable conductors to respectively mating contacts of a card-edge connector in the one preferred cable assembly embodiment may be most easily effected simultaneously through the use of a reflow soldering operation.

Prior to the connectorization of the terminated cable, it is generally desired that a portion of the resulting free end of the center film, together with any co-extensive forward portions of the leading pair of isolating strips that remain secured thereto, be trimmed back a predetermined distance. The remaining outwardly protruding portions of the center film and isolating strips thus can provide effective shielding between the two arrays of connector contacts along any region therebetween that does not have a portion of the folded back end section of the cable interposed therebetween.

In accordance with another preferred embodiment of the invention, the isolating strips are adapted to adhere more firmly to the associated conductors and the adjacent one of the two outer films than to the center film. As a result, the folded-back conductor end portions in each array remain laminated between the associated outer film and at least that portion of the isolating strip that is co-extensive therewith. Such terminated conductor end portions can then be readily accessed by insulation-displacement contacts of a female type connector.

In addition, in accordance with another aspect of the invention, an appreciable rearward portion of each isolating strip remains sandwiched between the center film and the associated array of conductors along a region at least substantially co-extensive with the folded-back conductor end portions. As a result, two additional thicknesses of isolating strip material are interposed between the two arrays of folded-back conductor end portions, thus significantly increasing the dielectric shielding therebetween, as positioned within the connector.

BRIEF DESCRIPTION OF THE DRAWINGS

FIG. 1 is a side elevational view, partially in section, of a first illustrative flat cable assembly embodiment wherein the cable comprises upper and lower arrays of offset ribbon-like conductors, and wherein the cable is terminated for connectorization in a female type connector, in accordance with the principles of the present invention;

FIG. 2 is a fragmentary cross-sectional view of the flat cable of FIG. 1, taken along the line 2—2 of that FIG;

FIG. 3 is a fragmentary side elevational view of a terminated end section of the flat cable of FIG. 1, with an end section of each outer film, together with the associated array of conductor end portions bonded thereto, shown after having been only slightly separated from the previously co-extensive and contacting one of the leading pair of isolating strips preparatory to the complete termination of the cable for connectorization;

FIG. 4 is a fragmentary side elevational view of the partially terminated end of the cable depicted in FIG. 3, but after the outer film end sections, and the co-extensive conductor end portions respectively bonded thereto, have been folded back upon themselves, such that the then outer major exposed surfaces of the conductor end portions in each array are postioned for connectorization, as part of a terminated male cable end, in either a solder or solderless female-type connector, in accordance with the principles of the present invention;

FIG. 5 is an enlarged fragmentary side elevational view, partially in section, of the cable as terminated in FIG. 4, and after the folded back end thereof has been interposed between two arrays of outwardly extend contacts of a card-edged type connector of the type only generally depicted in FIG. 1, with the respectively mating conductor ends and contacts being permanently secured by solder to form a composite cable-connector assembly embodying the principles of the present invention;

FIG. 6 is a fragmentary plan view, taken along the line 6—6 of FIG. 5, of several conductors in the upper array of the cable as soldered to the overlying mating contacts of the connector depicted in FIG. 5, and further illustrates the slightly offset but compatible relationship that exists between the conductor end portions and the connector contacts as a result of the offset established between the two arrays of conductors in a preferred form of the cable, as manufactured, and FIG. 7 is an enlarged fragmentary side elevational view similar to FIG. 4, but distinguishing therefrom by incorporating isolating strips that adhere more firmly to the associated conductors and outer films than to the center film, thus resulting in the folded-back conductor end portions in each array being laminated between the associated outer film section and leading isolating strip, for subsequent connectorization in a female-type connector having insulation displacement contacts.

DETAILED DESCRIPTION OF THE INVENTION

It should be appreciated that while the invention is described in detail herein primarily in regard to connecting flat cable, having two overlying/underlying arrays of ribbon-like conductors to connectors of the female or so-called card-edge solder types, the methods employed to terminate and connectorize such flat cable are also applicable for use with various types of solderless connectors.

With particular reference now to FIGS. 1 and 2, there is depicted a connectorized flat cable assembly 10 comprised, in part, of a flat cable 12, particularly adapted for under-carpet wiring applications, comprised of two slightly offset arrays of rectangularly shaped conductors 13, 14, best seen in FIG. 2, which are separated by an insulative center film 16, with each array being laminated between the center film and a respectively adjacent one of two insulative outer films 18, 19. The conductors are typically made of copper, and the insulative films may be made out of any one of a number of suitable plastic materials, one preferred material being polyester. The outer films are preferably manufactured with an adhesive coating 21 (or 22) on one side thereof, such as a pressure-sensitive polyester adhesive.

Also forming a part of the composite cable 12 are two arrays of longitudinally spaced insulative isolating strips 23, 24, each array being positioned on a different side of the center film 16, with corresponding strips in the two arrays being aligned in mutually disposed pairs, either before or during the manufacture of the cable, such as at 5, 10 or 15 ft. intervals. Depending on the choice of plastic material employed to form the isolating strips 23, 24, and/or on whether an adhesive backing is initially applied to a particular side thereof as positioned in the cable, they may be made to selectively adhere firmly, lightly or not at all to either the center film 16, or to the associated outer film 18 (or 19), and to the particular array of conductors bonded to the latter.

In accordance with one preferred cable termination method involved in connectorizing the flat cable assembly 10, the isolating strips 23, 24 are chosen to be of a type that will only adhere to the center film 16. To this end, the isolating strips may be made of Teflon* resin polymer plastic, having a heat-activated adhesive backing, such as of polyester, on only the side thereof which faces the center film 16, when the latter is of bare Mylar* plastic film, for example (*registered trademarks of the E. I. du Pont de Nemours Company). When the outer films 18, 19 are of the same material, and have pressure sensitive polyester adhesive coatings thereon, for example, the non-adhesive side of the Teflon plastic isolating strips will not even lightly adhere to such films, or to the contacting conductors after the laminating operation.

It should be understood that a suitable resinous material, or a non-conductive coating, in the form of a lacquer, by way of examples, could also be applied to the center film, or to the conductors, in those regions where the isolating strips would otherwise be employed, and which would allow the conductors to be readily separated from the adjacent side of the center film. Alternatively, the center film could be of an insulative plastic material that could be cured to a different stage along those terminating cable sites where the isolating strips would otherwise be positioned so as to prevent the center film from adhering to either the adjacent conductors or the associated outer film. Concomitantly, the laminating pressure could be removed from the cable during its manufacture along those regions chosen for termination so as to facilitate separation of the conductors from the center film. However, in terminating and connectorizing a flat cable of the type of primary concern herein, it has been found advantageous to utilize discrete isolating strips to facilitate those operations, for reasons described in greater detail both hereinbelow and in the aforementioned co-pending application of W. A. Elliott et al.

The second major part of the connectorized flat cable assembly 10, as depicted in FIG. 1, comprises a conventional connector 26 of the so-called card-edge type, which will be described in greater detail hereinafter. Associated with the connector is a suitable strain relief 27, shown only schematically, that is firmly secured to a portion of the cable near the terminated end thereof, and to a rearward portion of a housing 29 of the connector. Such strain reliefs may be of conventional design, the only requirement being that they be compatible with a particular connector.

Consideration is now directed in detail to the one aforementioned preferred method of terminating a given length of the cable 12 embodiment for connectorization, and to the physical construction of the resulting terminated cable end in accordance with the principles of the present invention. Initially, each successively severed end of the cable 12, as advanced from a supply thereof (not shown), is preferably chosen to terminate at the mid-point of a given pair of isolating strips 23, 24, as indicated in FIGS. 3 and 4. In accordance with the first preferred embodiment, the isolating strips, as previously noted, are of the type that will at least lightly bond to the center film 16, but not to either the associated contacting conductors 13 (or 14) or outer film 18 (or 19).

With the cable end thus defined, a terminating section 18a, or 19a of each outer film, together with the associated co-extensive array of conductor end portions 13a, or 14a bonded thereto, is initially separated or peeled from the previously contacting isolating strip 23, or 24, as depicted in FIG. 3, with that separated film section thereafter being sharply folded back upon itself, as depicted in FIG. 4. This provides a male-type cable termination which can be readily accessed by the connector 26, best seen in FIG. 5. As previously noted, the connector 26 is of the so-called card-edge type, one form of which is sold by the AMP Company.

In such a connector, the two mutually disposed and outwardly extending, arrays of contacts 31, 32 are normally constructed, and mounted, such that they cooperate to provide a predetermined degree of spring-biased compressive force therebetween when accessed. More specifically, whenever a folded-back terminated end of the cable 12, with opposite side arrays of exposed conductor end portions, is inserted between the two arrays of contacts 31, 32 appreciable compressive force is exerted by the contacts on the respectively mating conductors. Such spring-biased conductor-contact engagement is further augmented as a result of the folded-back outer film sections 18a, 19a of the terminated cable, together with the respectively associated arrays of conductor end portions 13a, 14a bonded thereto, advantageously inherently exhibiting appreciable compressive resiliency.

The resulting combined forces are thus seen to facilitate maintaining the terminated conductor end portions 13a, 14a of the cable in proper mating registry with the respective outwardly extending connector contacts 31, 32 until permanent connections are effected therebetween, such as through the use of soldering, ultrasonic or thermocompression bonding, or welding techniques. In the case of soldered connections, indicated by the solder filltes 34, they may advantageously be effected either individually, or simultaneously, the latter being most readily accomplished by reflow soldering.

As a result of the cooperative and resilient male-female relationship that is established between the folded-back terminated end of the cable 12 and any given pair of properly constructed and mutually disposed arrays of connector contacts, the cable-connector assemblies may take any one of a number of other forms. For example, depending on the manner in which the connector contacts are configured and mounted in any given connector of the female type, reliable electrical connections may be readily established between the latter and the terminated end of the cable 12 based on not only soldered, bonded or welded securements, but also on releasable, spring-biased frictional or insulation-displacement type securements, the latter type described in greater detail hereinafter.

With reference again to FIG. 4, it is seen that upon folding back the end sections 18a, 19a of the outer films, together with the co-extensive conductor end portions 13a, 14a respectively bonded thereto, there would normally remain a forward protruding free end portion 16a of the center film 16, together with any co-extensive forward portions of the leading pair of isolating strips 23, 24 that may remain bonded thereto, as partially shown in phantom. Such free end cable portions are normally simultaneously trimmed back, but typically only to a point that still allows them to provide effective electrical shielding between the two arrays of connector contacts in any region forward of the leading folded back end of the cable, as inserted in the connector (see FIG. 5).

As also depicted in FIGS. 3-5, it may often be desirable to leave a rearward portion of each isolating strip sandwiched between the center film 16 and the associated outer film 18 (or 19) so as to more firmly anchor the leading pair of isolating strips to the center film. Such rearwardly extending portions of the isolating strips can also serve an alternative and equally important shielding function which will be described in greater detail in connection with another preferred terminated cable embodiment.

FIG. 6 is a fragmentary plan view of several of the folded-back cable conductor end portions 13a and respectively mating connector contacts 31 as permanently secured together, for example, by the aforementioned solder fillets 34. As illustrated, the width of each conductor is advantageously chosen relative to the width of each contact such that reliable connections may be established therebetween even though corresponding ones of the conductors in the two arrays thereof are preferably slightly offset with respect to each other as laminated within the cable.

FIG. 7 illustrates a second preferred terminated cable embodiment 12', wherein all structural elements corresponding generally to those in FIGS. 1-6 are identified by like, but primed, reference numerals. In this second embodiment, the isolating strips 23', 24' are chosen of a material, or fabricated with selective adhesive backings thereon, that result in their adhering at least more firmly to the respectively associated conductors 13', 14' and outer films 18', 19' than to the center film 16', if at all to the latter. Isolation strips made of polyester plastic, with properly chosen adhesive backings, such as polyester or acrylic compositions, are particularly advantageous for this purpose, especially when the center and outer films are of Mylar plastic.

With the cable 12' thus constructed, upon folding back each terminated outer film section 18a' or 19a', and the associated and adhering isolating strip portion 23a', or 24a', together with the particular interposed (and hermetically sealed) array of conductor end portions 13a, or 14a, as a composite unit, the resulting male-type terminated end of the cable 12' is adapted for use with conventional female connectors having contacts of the insulation displacement (or piercing) type.

In such a connectorized cable assembly, it is seen that the connector contacts in each array must pierce through not only the thickness of the then outermost folded-back portion of the associated isolating strips 23', or 24', but also the thickness of the then immediately adjacent folded back outer film section 18a' or 19a' of the associated outer film. In such a case, the isolating strips 23', 24', in particular, could be made out of a readily pierceable material while still exhibiting a high dielectric constant.

With the dimensions of the isolating strips also being chosen such that an appreciable rearward portion thereof remains sandwiched between the center film 16' and the associated array of conductors, there are actually seven layers of insulative material interposed between the outermost corresponding ones of the terminated conductor end portions 13a', 14a' of the two arrays thereof. As a result, a very high dielectric voltage breakdown constant is insured between the two terminated arrays of conductor end portions, notwithstanding the fact that the cable films and isolating strips typically would have thicknesses in the range of only 0.002 to 0.008 inch. Such increased terminated conductor array separation would advantageously prevent shorts therebetween, even in the case where an insulation-displacement contact of a particular connector might possibly pierce through not only the thickness of the outermost folded-back portion of the associated isolating strip, outer film section and aligned conductor end portion, but possibly even extend into or pierce through the adjacent non-folded back portion of the outer film at the terminated end of the cable.

While several related and preferred flat cable connector assemblies, as well as methods for terminating and connectorizing the cable thereof, have been disclosed herein, it is obvious that various modifications may be made to the present illustrative embodiments and methods of the invention, and that a number of alternative related embodiments and methods could be devised by one skilled in the art without departing from the spirit and scope of the invention.

What is claimed is:

1. A flat cable assembly comprising:
   a connector having two underlying/overlying arrays of laterally disposed cable conductor-mating elements supported by an associated housing, and
   a flat cable of given length having two laterally disposed, underlying/overlying arrays of conductors separated by an insulative center film, with the conductors in each array being respectively interposed between a different side of the center film and a respectively associated one of two insulative outer films, also wherein two laterally disposed isolating strips of insulative material are respectively located and aligned on opposite sides of said center film, thus being interposed between the latter film and the adjacent one of said two arrays of conductors at the terminated end of said cable, as fabricated, said isolating strips being of of a material that only selectively adheres to said center film and associated outer film, the latter having said associated array of conductors bonded thereto, and further wherein a short longitudinally disposed end section of each outer film, and the co-extensive array of conductor end portions bonded thereto, are separated from at least said center film along a longitudinally disposed end region of the latter that at least initially was in contact with one of said isolating strips, by being sharply folded back on themselves, said conductor end portions in said two arrays thus being spaced further apart by at least the interposed folded back sections of the outer films, while still maintained in precise alignment, with each such folded-back conductor end portion in each array being electrically connected to a different aligned one of said mating connector elements of the associated array thereof in said connector.

2. A flat cable assembly comprising:
a connector having two underlying/overlying arrays of laterally disposed cable conductor-mating elements supported by an associated housing, and
a flat cable of given length having two underlying-/overlying arrays of laterally disposed conductors separated by an insulative center film, with the conductors in each array being respectively interposed between a different side of the center film and a respectively associated one of two insulative outer films, also wherein two laterally disposed isolating strips of insulating material are respectively located and aligned on opposite sides of said center film, thus being interposed between the latter film and the adjacent one of said two arrays of conductors at the terminated end of said cable, as fabricated, said isolating strips being of a material that does not bond to said initially contacting array of conductors, or to the adjacent one of said outer films, and further wherein a short longitudinally disposed end section of each outer film, and the co-extensive array conductor end portions bonded thereto, are separated from at least a longitudinally disposed portion of the initially contacting one of said isolating strips, by being sharply folded back on themselves so that the then outermost sides of the conductor end portions in each array are exposed, with each such exposed conductor end portion in each array being electrically connected to a different aligned one of said mating connector elements of the associated array thereof in said connector.

3. A flat cable assembly in accordance with claim 2 wherein said conductors are of rectangular cross-section, with their major surfaces lying in the major plane of said cable, as fabricated.

4. A flat cable assembly in accordance with claim 2 wherein said exposed, folded-back conductor end portions in each array are soldered to the respectively mating connector elements of said connector.

5. A flat cable assembly in accordance with claim 2 further comprising a strain relief number interconnecting said cable, at a point rearward of the terminated folded-back end thereof, to the housing of said connector.

6. A flat cable assembly in accordance with claim 3 wherein said electrical connections are effected with mating connector elements of the solderless type.

7. A flat cable assembly in accordance with claim 2 wherein said conductors are of rectangular cross-section, with their major surfaces lying in the major plane of said cable, wherein the corresponding conductors in said two arrays as confined within said cable are offset a predetermined distance relative to each other, and wherein said outer and center films are of polyester plastic material, and said isolating strips comprise tapes also formed out of plastic material, and adapted to at least lightly bond to said center film.

8. A flat cable assembly in accordance with claim 7 wherein at least a portion of the free end of the center film, and any portions of the pair of isolating strips that remain secured thereto, are trimmed back at least a predetermined distance from their original as-severed free ends, as a result of said outer films and the respectively associated arrays of conductor end portions bonded thereto having been folded back upon themselves.

9. A flat cable assembly in accordance with claim 8 wherein the corresponding conductors in said two arrays, as confined within said cable, are offset a predetermined distance relative to each other.

10. A flat cable assembly comprising:
a connector having two underlying/overlying arrays of laterally disposed cable conductor-mating elements supported by an associated housing, and
a flat cable of given length having two underlying-/overlying arrays of laterally disposed conductors separated by an insulative center film, with the conductors in each array being respectively interposed between a different side of the center film and a respectively associated one of two insulative outer films, also wherein two laterally disposed isolating strips of insulating material are respectively located and aligned on opposite sides of said center film, thus being interposed between the latter film and the adjacent one of said two arrays of conductors at the terminated end of said cable, as fabricated, said isolating strips being of a material adapted to adhere more firmly to said associated array of contacting conductors and outer film than to said center film, and wherein a short, longitudinally disposed terminated end section of each other film, and at least a substantial forward coextensive portion of the associated isolating strip, separated from said center film, and as bonded to said outer film section, together with the array of co-extensive conductor end portions interposed therebetween, are folded back upon themselves, with each then folded-back and insulation-covered conductor end portion in each array being electrically connected to a different aligned one of said mating connector elements as a result of the latter being of the insulation-displacement type.

11. A flat cable assembly in accordance with claim 10 wherein an appreciable rearward, longitudinally disposed portion of each isolating strip remains interposed between the center film and the associated array of conductors so as to provide additional insulative shielding between the two arrays of folded-back and connectorized conductor end portions.

12. A flat cable assembly in accordance with claim 11 wherein said conductors are of rectangular cross-section, with their major surfaces lying in the major plane of said cable, wherein the corresponding conductors in said two arrays as confined within said cable are offset a predetermined distance relative to each other, and wherein said outer and center films are of polyester plastic material, and said isolating strips are in the form of tapes and also of plastic material, and wherein said cable assembly further comprises a strain relief member interconnecting said cable, at a point rearward of the terminated folded-back end thereof, to the housing of said connector.

13. A flat cable assembly in accordance with claim 12 wherein at least a portion of the free end of the center film is trimmed back at least a predetermined distance from its original as-severed free end, as a result of said outer film sections, together with the respectively associated arrays of conductor end portions and isolating strips bonded thereto, having been folded back upon themselves.

14. A method of connectorizing a terminated end of a flat cable of given length having two overlying/underlying arrays of laterally disposed conductors respectively laminated between a different side of a common insulative center film and an associated one of two opposite side insulative outer films, and wherein at least two isolating strips of insulative material are respectively located on opposite sides of, and extend transversely across, the center film in alignment along an end region of the cable, as fabricated, and terminated, the isolating strips being of a material that allows those end portions of the conductors in each array that are initially co-extensive and in contact with the associated one of said isolating strips to be readily separated at least from said center film, for connectorization, said method comprising the steps of:

separating at least a substantial longitudinally disposed end section of each outer film at the terminating end of said cable, together with the associated array of conductor end portions bonded thereto, from at least a substantial longitudinally disposed and co-extensive portion of the center film;

folding back upon itself at least said short end section of each outer film, together with the array of conductor end portions bonded thereto, so as position the conductor end portions in the two arrays farther apart by at least the interposed folded-back sections of the outer films, while still maintaining the conductor end portions in precise alignment, and inserting the terminated folded-back end of the cable within a female-type connector having two mutually disposed arrays of conductor-mating contacts, said contacts in each array thereof being adapted to conductively engage the respectively aligned folded-back conductor end portions in the associated one of the two arrays thereof.

15. A method of connectorizing a terminated end of a flat cable of given length having two overlying/underlying arrays of laterally disposed conductors respectively laminated between a different side of a common insulative center film and an associated one of two opposite side insulative outer films, and wherein at least two isolating strips of insulative material are respectively positioned on opposite sides of, and extend transversely across, the center film in alignment along an end region of the cable, as fabricated and terminated, the isolating strips being of a material that allows those portions of the conductors in each array that are initially co-extensive and in contact with the associated one of said isolating strips to be readily separated therefrom, for connectorization, said method comprising the steps of:

separating at least a substantial longitudinally disposed end section of each outer film at the terminating end of said cable, together with the associated array of conductor end portions bonded thereto, from at least a substantial longitudinally disposed and co-extensive portion of the associated one of said pair of isolating strips;

folding back upon itself said short end section of each outer film, together with the array of conductor end portions bonded thereto, so as to expose the then outermost surfaces of the latter for connectorization, and inserting the terminated folded-back end of the cable within a female-type connector having two mutually disposed arrays of conductor-mating contacts, said contacts in each array thereof being adapted to conductively engage the respectively aligned and outer surface-exposed folded-back conductor end portions in the associated one of the two arrays thereof.

16. A method in accordance with claim 15 wherein said step of conductively engaging said connector contacts with said respectively aligned and outer surface-exposed conductor end portions is effected by applying molten solder thereto.

17. A method in accordance with claim 15 wherein said step of conductively engaging said connector contacts with said respectively aligned and outer surface-exposed conductor end portions is effected by force-fit inserting said folded-back cable end between the two arrays of contacts and slightly expanding the spacing therebetween.

18. A method in accordance with claim 15 further including the step of:

securing an end region of said cable, immediately rearward of the folded-back terminated end thereof, to a housing portion of said connector so as to provide strain relief for the conductively engaged conductor end portions and the respectively associated connector contacts.

19. A method in accordance with claim 15 wherein said isolating strips are adapted to at least lightly bond to the center film, and said method further including the step of trimming off at least a portion of the resulting free end of the center film, together with those forward portions of the isolating strips that remain secured thereto after the fold-back step.

20. A method in accordance with claim 15 wherein said isolating strips are of plastic material, and adapted to at least lightly bond to the center film.

21. A method in accordance with claim 16 wherein said isolating strips are adapted to at least lightly bond to the center film, and said method further including the step of trimming off at least a portion of the resulting free end of the center film, together with those forward portions of the isolating strips that remain secured thereto after the fold-back step.

22. A method in accordance with claim 15 wherein a rearward portion of each of the isolating strips remains sandwiched between said center film and the associated one of said outer films after the fold-back step, and wherein said isolating strips are bonded to said center film.

23. A method in accordance with claim 22 further including the step of trimming off at least a portion of the resulting free end of the center film, together with those forward portions of the isolating strips that are bonded thereto after the fold-back step.

24. A method of connectorizing a terminated end of a flat cable of given length having two overlying/underlying arrays of laterally disposed conductors, the latter being respectively laminated between a common insulative center film and an associated one of two opposite side insulative outer films, and wherein two isolating strips of insulative material are respectively positioned on opposite sides of, and extend transversely across, the center film in alignment at a predetermined termination site along the cable, as fabricated, and each being adapted to adhere more firmly to the associated array of contacting conductors and outer film than to said center film, thus allowing those portions of the conductors in each array that are initially co-extensive, and in contact, with the associated one of said isolating strips to be readily separated from said center film, for connectorization, said method comprising the steps of:

separating a longitudinally disposed end section of each outer film, together with the associated array of co-extensive conductor end portions, and at least that forward portion of the associated isolating strip both bonded thereto, from the previously longitudinally disposed and co-extensive region of the center film;

folding-back upon itself said short end section of each outer film, and at least the co-extensive forward portion of the associated isolating strip bonded thereto, together with the array of co-extensive conductor end portions sandwiched therebetween so as to terminate said two arrays of conductor end portions with increased insulated spacing therebetween, and inserting the terminated folded-back end of the cable within a female-type connector having two mutually disposed arrays of conductor-mating contacts, said contacts being of the insulation-displacement type to conductively engage the respectively aligned and folded back conductor end portions in the two arrays thereof.

25. A method in accordance with claim 24 wherein a rearward portion of each of the pair of isolating strips remains sandwiched between said center film and the associated one of said outer films, along a longitudinally disposed region of said cable that is at least substantially co-extensive with the folded-back section of the associated outer film.

26. A method in accordance with claim 25 further comprising the step of trimming off at least a portion of the resulting free end of the center film, after the foldback step.

27. A terminated flat cable adapted for connectorization in a female-type connector, said cable of indefinite length comprising:

two underlying/overlying arrays of laterally disposed conductors separated by an insulative center film, with the conductors in each array being respectively interposed between a different side of the center film and a respectively associated one of two insulative outer films, also wherein two laterally disposed isolating strips of insulative material are respectively positioned on opposite sides of said center film in alignment, thus being interposed between the latter film and the adjacent one of said two arrays of conductors as the end of said cable, as fabricated and terminated, said isolating strips being of a material that only selectively adheres to said center film and associated outer film, the latter having said associated array of conductors bonded thereto, and wherein a short longitudinally disposed end section of each outer film, and the co-extensive array of conductor end portions bonded thereto, are separated from at least said center film, along a longitudinally disposed end region of the latter that at least initially was in contact with one of said isolating strips, by being sharply folded back on themselves, said conductor end portions in said two arrays thus being spaced farther apart by at least the interposed folded-back sections of the outer films, while still maintained in precise alignment, for subsequent access by respectively aligned contacts of a female-type connector.

28. A terminated flat cable in accordance with claim 27 wherein said isolating strips are of plastic material, and adapted to remain at least lightly bonded to said center film after the respectively associated arrays of conductor end portions have been folded back, thus positioning and exposing the then outermost sides of the conductor end portions in each array for subsequent direct conductive engagement with respectively associated contacts of a female-type connector.

29. A terminated flat cable in accordance with claim 27 wherein the isolating strips are adapted to adhere more firmly to said respectively associated array of contacting conductors and outer film than to said center film, such that as a result of each of said terminated outer film sections, and the particular array of conductor end portions bonded thereto, being folded back upon themselves, at least a substantial forward portion of the associated isolating strip is also readily separated from said center film and folded back upon itself, while remaining secured to the associated outer film section, and the array of conductor end portions interposed between said outer film section and isolating strip forward portion, the insulation covered conductor end portions in each array thus being adapted for subsequent connectorization with respectively aligned insulation displacement type contacts of a female-type connector.

30. A method of preparing a terminated end of a flat cable of indefinite length for connectorization, wherein said cable includes two overlying/underlying arrays of laterally disposed conductors respectively laminated between a different side of a common insulative center film and an associated one of two opposite side insulative outer films, and wherein at least two isolating strips of insulative material are respectively located on opposite sides of, and extend transversely across, the center film in alignment along an end region of the cable, as fabricated, and terminated, the isolating strips being of a material that allows those end portions of the conductors in each array that are initially co-extensive and in contact with the associated one of said isolating strips to be readily separated at least from said center film, for connectorization, said method comprising the steps of:

separating at least a substantial longitudinally disposed end section of each outer film at the terminating end of said cable, together with the associated array of conductor end portions bonded thereto, from at least a substantial longitudinally disposed and co-extensive portion of the center film;

folding back upon itself at least said short end section of each outer film, together with the array of conductor end portions bonded thereto, so as to position the conductor end portions in the two arrays farther apart by at least the interposed folded-back sections of the outer films, while still maintaining the conductor end portions in precise alignment, and the latter being positioned for subsequent access by respectively aligned contacts of a female-type connector.

31. A method in accordance with claim 30 wherein said isolating strips are adapted to at least lightly bond to the center film after the respectively associated arrays of conductor end portions have been folded back, thus positioning and exposing the then outermost sides of the conductor end portions in each array for subsequent direct conductive engagement with respectively associated contacts of a female-type connector.

32. A method in accordance with claim 30 wherein the isolating strips are adapted to adhere more firmly to said respectively associated array of contacting conductors and outer film than to said center film, such that as a result of each of said terminated outer film sections, and the particular array of conductor end portions bonded thereto, being folded back upon themselves, at least a substantial forward portion of the associated isolating strip is also readily separated from said center film and folded back upon itself, while remaining secured to the associated outer film section, and the array of conductor end portions interposed between said outer film section and isolating strip forward portion, the insulation covered conductor end portions in each array thus being adapted for subsequent connectorization with respectively aligned insulation displacement type contacts of a female-type connector.

33. A method in accordance with claim 30 further comprising the step of:
trimming off at least a portion of the resulting free end of the center film, together with those portions of the isolating strips that remain secured thereto, after the fold-back step.

34. A method in accordance with claim 32 wherein an appreciable rearward, longitudinally disposed portion of each one of the pairs of isolating strips remains interposed between the center film and the associated array of conductors so as to provide additional insulative shielding between the two arrays of folded-back conductor end portions.

35. A method in accordance with claim 34 further including the step of trimming off at least a portion of the free end of the center film after the fold-back step.

* * * * *